United States Patent [19]

Durgin et al.

[11] Patent Number: 5,498,311
[45] Date of Patent: Mar. 12, 1996

[54] PROCESS FOR MANUFACTURE OF PRINTED CIRCUIT BOARDS

[75] Inventors: David L. Durgin; Robert J. Malins; Richard T. Hoke, all of Albuquerque, N.M.

[73] Assignee: Quatro Corporation, Albuquerque, N.M.

[21] Appl. No.: 260,746

[22] Filed: Jun. 15, 1994

[51] Int. Cl.$^6$ .............................. B44C 1/22; C23F 1/00; B29C 37/00
[52] U.S. Cl. .................. 216/20; 216/35; 216/67; 216/48; 216/78
[58] Field of Search .................... 156/630, 634, 156/645, 650, 656, 643, 659.1, 901, 902; 427/97; 29/852

[56] References Cited

U.S. PATENT DOCUMENTS

| | | | |
|---|---|---|---|
| 4,705,592 | 11/1987 | Bahrle et al. | 156/630 |
| 4,853,081 | 8/1989 | Mlynko | 156/643 |
| 5,284,548 | 2/1994 | Carey et al. | 156/630 |
| 5,376,232 | 12/1994 | McKenney | 156/656 |

*Primary Examiner*—William Powell
*Attorney, Agent, or Firm*—Ronald R. Snider

[57] ABSTRACT

A method for manufacture of printed circuit boards uses plasma etch back/desmear, carbon deposits on board surfaces to be plated and panel plating. The plated board is abrasively pre-treated, imaged, developed, etched, and stripped for final preparation before drilling. The pre-treating, imaging, developing, etch back and stripping used for inner panel boards is the same as the process steps and equipment used for the final process of the panel plated boards. The process is environmentally conscious in that it produces waste products which contain only one metal in solutions easily treated by conventional and non-conventional waste treatment technologies and eliminates or reuses by-products produced by other printed circuit board and produces waste products which contain only one metal.

16 Claims, 2 Drawing Sheets

PROCESS FOR MANUFACTURE OF PRINTED CIRCUIT BOARDS

BACKGROUND OF THE INVENTION

1. Field of the Invention

This invention is in the field of processing for printed wiring boards or printed circuit boards.

2. The Prior Art

The current method for fabrication of printed circuit boards is shown in FIG. 2. This method is complex and produces waste products which are difficult to treat and handle in an environmentally responsible manner. The byproducts of the standard process include solutions of tin, chelated copper, palladium, manganese, and cyanides, as well as expended surface oxide treatment solutions. Byproducts from the standard process may include lead.

The standard process as shown in FIG. 2 begins with a copper laminate board which is imaged at step 20' and which is developed, etched and stripped at step 30'. Next, each board is oxidized in an oxide step 35'. A plurality of boards are then pressed together in a press 40', drilled at step 50 and deburred at step 60'. In step 70', there is a desmear and etchback which is based upon potassium permanganate which produces manganese containing solutions as byproducts. The boards cleaned in the desmear/etchback are then processed by electroless copper surface to hole ratios at step 80. This step produces a formaldehyde and chelated copper byproduct resulting in greater sludge and increased treatment efforts. At step 100', the boards are scrubbed.

The pressed and drilled board is then imaged again at step 20', developed, etched and stripped at step 30' in preparation for electroplating by the pattern plating method at step 110'. The pattern plated boards are then stripped at step 120', etched at step 130' and stripped at step 140'. Steps 110', 120', 130' and 140', produce tin and/or tin/lead containing solutions as byproducts. The chemistry of the step 120'–140' is complex and produces byproducts which are difficult to handle from an environmental standpoint.

In this standard process, there are two separate develop etch strip steps, a potassium permanganate process for desmear/etchback, and an electroless plating step for making holes receptive to plating.

The prior art includes plasma desmear/etchback as illustrated in U.S. Pat. Nos. 5,082,547, 4,676,865, and 4,012,307. The prior art also includes U.S. Pat. Nos. 4,684,560, and 4,619,741, which cover a process for depositing copper in drilled holes as used with this invention.

Finally, the process of panel electroplating is also well known in the printed circuit board manufacturing art. Applicant's invention consists of combining these technologies into an improved circuit board manufacturing method that is unique. Applicant has used an advanced simulation and modeling approach to optimize the printed circuit board manufacturing process and to minimize the waste generated by this processes. However, no one other than Applicant has selected the combination of process steps which provides the simplified operation in reduced number of process steps and reduced generation of environmentally dangerous byproducts.

BRIEF SUMMARY OF THE INVENTION

In this invention, applicant has combined the known processes of plasma desmear and etchback, non-metallic less resistant material deposition, panel plating and board pretreatment (otherwise known as "double treat") to provide an integrated printed circuit board fabrication ecofactory. The non-metallic process may use carbon black as a resistant agent (otherwise knows as the "Black Hole Process II". The non-metallic material is deposited in the holes and is subsequently microetched leaving a dielectric that facilitates plating through the holes in plating processes. Other materials which provide a less resistant or conductive coat of non-metallic material may be used. The method in accordance with this invention successfully eliminates byproducts which are now being produced by standard circuit board processing factories. These byproducts include solutions of palladium, cheleated copper, manganese, tin, tin/lead, formaldehyde, cyanides and other organic waste.

In Applicant's invention, the number of processing steps required to produce a complete operational printed wiring board is also substantially reduced. Applicant process uses treated board materials as process starting material to eliminate the need for an oxidizing step prior to pressing the boards together through a pressure and temperature bonding process. Applicant uses the same develop etch strip process for imaging the inner layer boards, as well as final imaging of the outer layers for the laminated board.

Applicant's selection of a plasma process for the desmear/ etch back process eliminates the production of manganese as a byproduct of the potassium permanganate based process step commonly used.

Applicant's invention provides simplified waste disposal treatment, and a reduced number of operations in the printed wiring board manufacturing process. This leads to savings in waste disposal, plant cost, and in plant space and equipment. The individual elements of Applicant's processing are however, known.

Those working in the art have not applied the rigorous analysis and selection process used by Applicant to arrive at the simplest, most efficient and least polluting solution to the problem of manufacturing printed wiring boards. Applicant has selected plasma, etch back/desmear, a MacDermid "Black Hole™" technology for carbon coating, and panel electroplating. The combination of these three elements enables Applicant to eliminate undesirable process byproducts and simplifies the entire operation as shown in FIG. 1.

DETAILED DESCRIPTION

Figure 1:
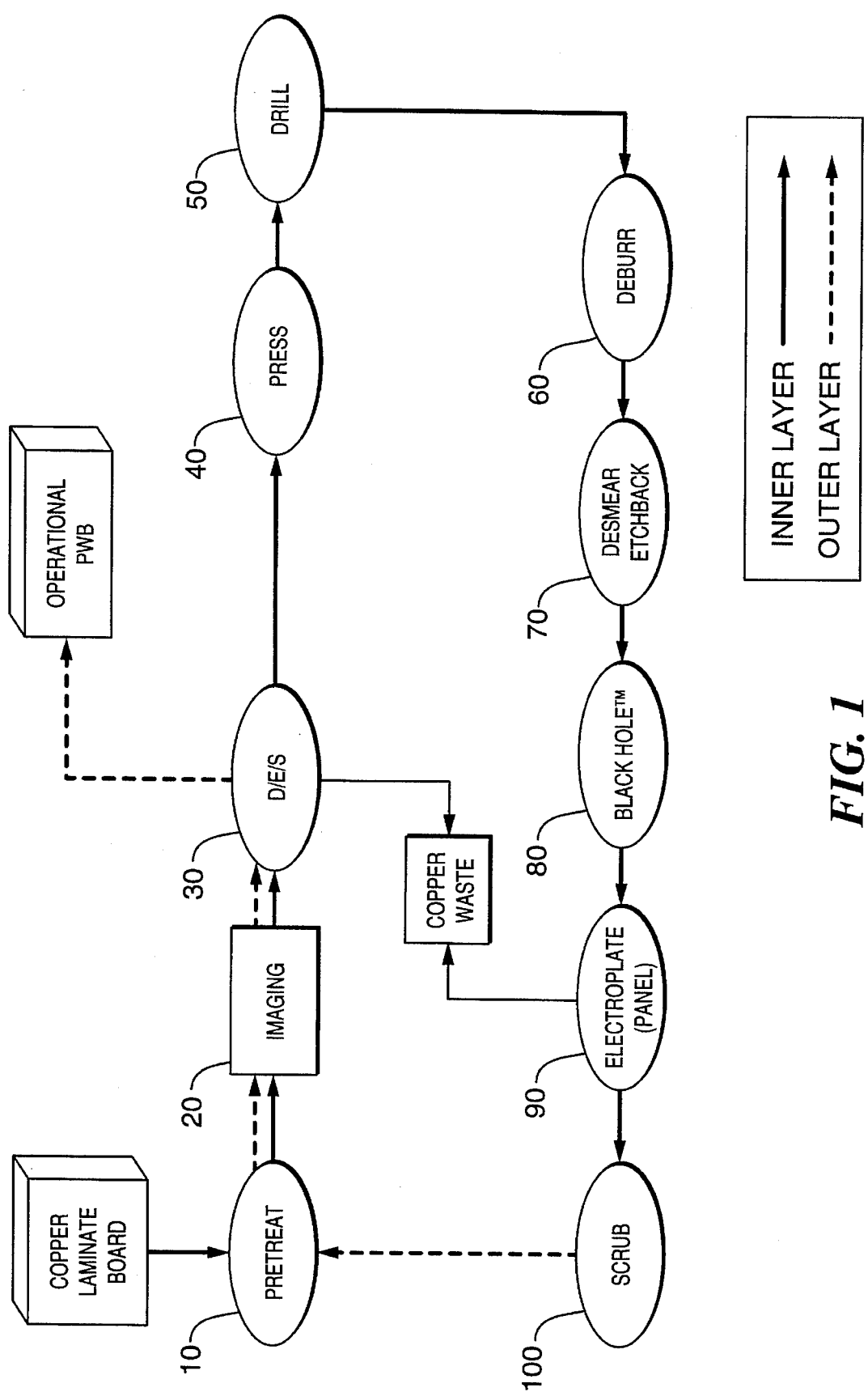
FIG. 1, shows a block diagram for the process of Applicant's invention.
Figure 2:
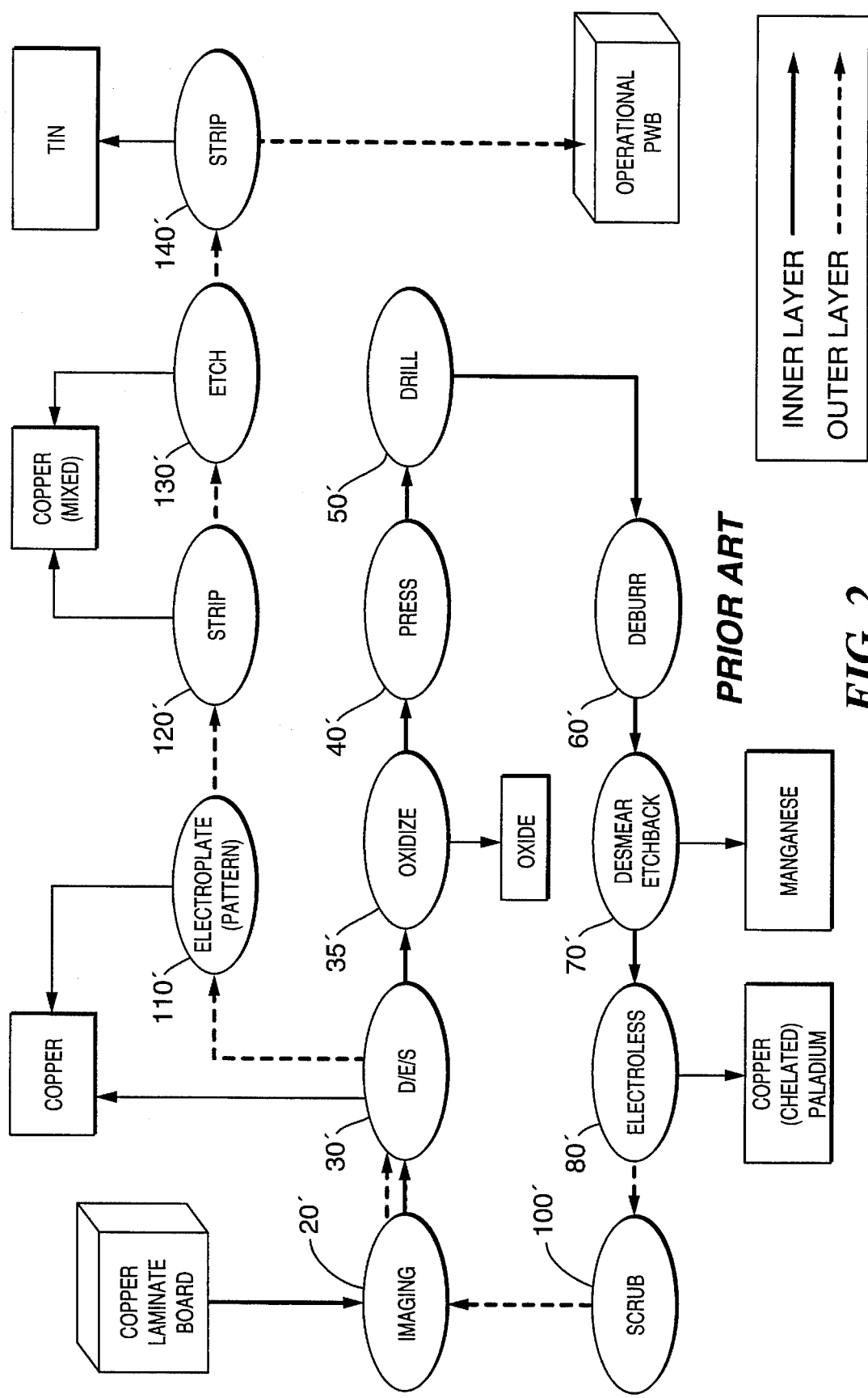
FIG. 2, shows in block diagram form the commonly used standard practice in the industry.

FIG. 1 shows the circuit board processing steps in accordance with this invention. The process begins with copper covered laminated boards. These laminated boards are ultimately pressed together to form a final operational printed wiring board.

In step 10, Applicant initiates the process with coated board stock wherein the raw copper covered laminated board, which is made out of epoxy and glass and has a copper cladding is covered with an organic protective layer, called "double treat". This step eliminates the brown/black oxide step, treatment by oxidizing acids used by other manufacturers in a step immediately before pressing the boards together.

The imaging step 20 is a photoimaging step where a photoresist is applied, and an image of the circuit pattern is placed on the photoresist. The imaging material covers the copper which will be retained.

The next step is the develop, etch and strip process 30. Here the copper areas which are exposed for removal of copper are subjected to an etch process to remove the copper which is not covered with the developed photoresist. In the strip step, the remaining photoresist film is stripped off from the board leaving exposed copper.

At the end of step 30, innerlayer boards are completed. The exposed innerlayer boards are then assembled and inserted into a press 40. The number of boards pressed together may be quite large, such as 10 or more. Prior to pressing, there is a prepreg material placed between each pair of panels which facilitates the bonding of the panels together during the pressing step.

The next step 50 is a drilling step which is a series of numerically controlled high speed drills which drill small holes through the sandwich of circuit board material coming from the press. During the drilling operation, small burrs of copper are created around each drilled hole and the drills create a layer of smeared epoxy which is epoxy that has been melted and reformed along the interior of the holes. It is well known in the art that this material must be removed prior to a further step of plating the hole interiors.

In step 60, Applicant provides for deburring and mechanical cleaning up of the hole in the circuit board.

In the etch back/desmear process, Applicant utilizes a plasma etch back/desmear process, which is well known and shown in U.S. Pat. Nos. 4,676,865, 5,082,547 and 4,012,307, each is incorporated herein by reference. In Applicant's process $CF_4$ and $O_2$ are used as components of a plasma gas. The byproduct of this process is generally a very fine dust made of the epoxy after it has reacted with the plasma. Each drilled hole after plasma etch and desmear includes exposed copper edges which are slightly exaggerated by removal of a small portion of the epoxy of each layer, thus providing a conductive surface for layer to layer interconnection.

In the previous pressing step 40, the outer boards are copper laminate boards which are coated with copper on their faces. Therefore, the plasma only effectively reacts with the inside of the holes because the outside of the board is protected by the copper layer.

In preparation for through hole plating, Applicant next applies a "Black Hole™" process in step 80. This is a process developed by Macdermid, Inc. and is described in U.S. Pat. No. 4,597,988. The "Black Hole™" process, carbon black is distributed along the interior faces of the holes. This is done by a flooding system or a spray system whereby spray nozzles carry a liquid and carbon black into the holes for coating. At the completion of the black hole process, a board comprises copper faces, with through holes covered with carbon black. Other non-metallic conductive materials may also be used instead of the carbon black.

The next step in Applicant's process is a panel plating step. In panel plating, the entire surface of the board and the holes is plated with another layer of copper. The plating within the holes is of particular high quality and especially efficient because in panel plating, the entire panel copper surface provides good electrical contact to the brim of each through hole. Therefore, electrical conductivity at the through hole edges is good. This improves plating to the black hole carbon material in the through hole.

After panel plating, the assembled board is ready for having the outer surfaces prepared. It can be seen in FIG. 1, the panel plated board is cleaned in a scrub operation 100 and sent to a pretreat operation 10. In the pretreat operation 10, the surface is roughed with a pumice or abrasive and water in order to provide proper surface cleanliness and quality for film adhesion.

The assembled board then is imaged at step 20 and goes through a develop etch strip process at 30 as described previously. The completed board from the developed etch strip process is then removed and prepared for further processing or shipping.

We claim:

1. A method of making printed wiring boards comprising the steps of:

initiating the process with a copper laminated board that has been coated with an organic surface protectant;

imaging said board by applying a photoresist and by photographically exposing said board;

developing, etching, and stripping said board;

adding at least one copper laminated board to said board to form a layered circuit board;

pressing said layered circuit board together;

drilling holes at locations in said layered circuit board;

deburring the drilled holes by mechanical means to remove copper particulate;

preforming a desmear/etchback process by means of a plasma desmear/etchback process;

covering exposed surfaces of said circuit board with a non-metallic less resistive/more conductive material;

panel plating said circuit board, copper surfaces and said surfaces which are covered with the non-metallic less resistive/more conductive material;

pre-treating said panel plated circuit board by abrading the copper surfaces of said panel plated boards;

imaging said panel plated board by applying a photoresist and by photographically exposing said board; and developing, etching, and stripping of said panel plated board.

2. A method in accordance with claim 1, wherein said step of covering the exposed copper surfaces with non-metallic conductive material comprises a step of applying a liquid dispersion of carbon black on all surfaces.

3. A method in accordance with claim 1, wherein said step of performing an etch back/desmear process uses a plasma gas comprising a mixture of oxygen and carbon tetrafluouride.

4. A method in accordance with claim 1, wherein said first step of developing, etching and stripping is identical to said second step of developing, etching and stripping.

5. A method in accordance with claim 1, wherein said first step of developing, etching and stripping and second step of developing, etching and stripping are performed with the same equipment.

6. A method in accordance with claim 1, wherein said pretreating step uses a pumice abrading material for abrading said board.

7. A method in accordance with claim 1 wherein waste products from said process comprise only products containing a single metal copper.

8. A method in accordance with claim 7, wherein said copper does not include cheleated copper.

9. A method in accordance with claim 1, further including a step of deburring drilled holes by mechanical means to remove copper particulate after said step of drilling holes.

10. A method for making printed wiring boards comprising the steps of:

drilling holes in a circuit board;

performing an etch back desmear operation on said board by means of plasma etch back/desmear;

covering surfaces of said holes with a carbon material; and panel plating said board and said hole surfaces.

11. A method in accordance with claim 10, further comprising the steps of:

imaging said board; and developing, etching and stripping said board.

12. A method in accordance with claim 11, wherein said step of developing, etching, and stripping is the same process as a developing, etching and stripping process used to prepare innerlayer boards.

13. A method in accordance with claim 11, further comprising the step of:

pre-treating said boards by abrading.

14. A method in according with claim 13, wherein said pretreating step uses a pumice abrading material to abrade the surfaces of said board.

15. A method in accordance with claim 2 wherein said dispersion of carbon black adheres primarily to exposed epoxy material, between copper layers, in the holes.

16. An environmentally conscious method of manufacturing a printed wiring board by minimizing or eliminating hazardous waste produced as a by-product of said method, comprising the steps of:

providing at least one laminated board having a non-conductive material interposed between two conductive metal layers, said board having at least one hole formed therein and extending from one conductive metal layer to the other;

performing desmear and etch back operations on said at least one hole using plasma gas comprising a mixture of oxygen and $CF_4$;

applying a liquid dispersion of a non-metallic electrically conducting substance on the non-conductive material and conductive metal surfaces;

electroplating a substantially continuous conductive metal layer over the applied non-metallic substance on said non-conductive surfaces and conductive metal surfaces;

applying photoresist to an outer surface of each of said conductive metal layers and to seal said at least one hole;

etching away unwanted copper from said conductive layers that are not protected by said photoresist; and removing said photoresist.

* * * * *